(12) United States Patent
Wei et al.

(10) Patent No.: US 12,274,147 B2
(45) Date of Patent: Apr. 8, 2025

(54) ORGANIC LIGHT EMITTING DISPLAY PANEL, METHOD FOR MANUFACTURING THE SAME AND ORGANIC LIGHT EMITTING DISPLAY APPARATUS

(71) Applicant: Everdisplay Optronics (Shanghai) Co., Ltd., Shanghai (CN)

(72) Inventors: Biming Wei, Shanghai (CN); Yanhu Li, Shanghai (CN); Liang Xu, Shanghai (CN); Hsin Chih Lin, Shanghai (CN); Haiyan Hao, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 422 days.

(21) Appl. No.: 17/551,316

(22) Filed: Dec. 15, 2021

(65) Prior Publication Data

US 2022/0199693 A1    Jun. 23, 2022

(30) Foreign Application Priority Data

Dec. 18, 2020  (CN) .......................... 202011505881.4
Dec. 18, 2020  (CN) .......................... 202023084105.X

(51) Int. Cl.
*H10K 59/38*     (2023.01)
*H10K 50/842*    (2023.01)
(Continued)

(52) U.S. Cl.
CPC ......... *H10K 59/38* (2023.02); *H10K 50/8426* (2023.02); *H10K 59/122* (2023.02); *H10K 71/00* (2023.02); *H10K 59/1201* (2023.02)

(58) Field of Classification Search
CPC .................................................. H10K 59/122
See application file for complete search history.

(56) References Cited

U.S. PATENT DOCUMENTS

| 2019/0340959 A1* | 11/2019 | Park ..................... H10K 59/873 |
| 2019/0355929 A1 | 11/2019 | Xu |
| 2021/0384461 A1* | 12/2021 | Kim ..................... H10K 50/844 |

FOREIGN PATENT DOCUMENTS

| CN | 101847650 A | 9/2010 |
| CN | 103972262 A | 8/2014 |

(Continued)

OTHER PUBLICATIONS

1st Office Action dated Jun. 28, 2024 of Chinese Application No. 202011505881.4.

(Continued)

*Primary Examiner* — Moazzam Hossain
*Assistant Examiner* — Hajar Kolahdouzan
(74) *Attorney, Agent, or Firm* — Qinghong Xu

(57) ABSTRACT

The present disclosure provides an organic light emitting display panel, a method for manufacturing the same, and an organic light emitting display apparatus. The organic light emitting display panel includes an array substrate, a color filter substrate and an encapsulation structure; the encapsulation structure includes a sealing frame and/or a sealing layer disposed between the array substrate and the color filter substrate, and the array substrate and the color filter substrate are adhesively fixed through the sealing frame and/or the sealing layer; wherein the sealing frame is formed by curing a frame sealant and is located in a frame area of the array substrate and the color filter substrate, and the sealing layer is formed by curing a filling adhesive and is located in a display area of the array substrate and the color filter substrate.

5 Claims, 14 Drawing Sheets

(51) Int. Cl.
*H10K 59/122* (2023.01)
*H10K 71/00* (2023.01)
*H10K 59/12* (2023.01)

(56) References Cited

FOREIGN PATENT DOCUMENTS

| | | | |
|---|---|---|---|
| CN | 107479241 | A | 12/2017 |
| CN | 108428802 | A | 8/2018 |
| CN | 109841756 | A | 6/2019 |
| CN | 110165071 | A | 8/2019 |
| CN | 110707132 | A | 1/2020 |
| CN | 110752317 | A | 2/2020 |
| CN | 211826840 | U | 10/2020 |
| CN | 111929936 | A | 11/2020 |
| CN | 214043668 | U | 8/2021 |
| KR | 20120119448 | A | 10/2012 |

OTHER PUBLICATIONS

2nd Office Action dated Nov. 27, 2024 of Chinese Application No. 202011505881.4.

\* cited by examiner

ORGANIC LIGHT EMITTING DISPLAY PANEL, METHOD FOR MANUFACTURING THE SAME AND ORGANIC LIGHT EMITTING DISPLAY APPARATUS

CROSS-REFERENCE

This application claims the benefit of priority to the Chinese Patent Application NO. 202011505881.4, filed on Dec. 18, 2020, and the Chinese Patent Application NO. 202023084105.X, filed on Dec. 18, 2020, the contents of which are both incorporated herein by reference in their entirety.

TECHNICAL FIELD

The present disclosure relates to the field of display technologies, and in particular to an organic light emitting display panel, a method for manufacturing the same and an organic light emitting display apparatus.

BACKGROUND

Compared with many display devices, organic light emitting display (OLED) devices have numerous advantages, such as all-solid-state, self-luminescence, wide viewing angle, wide color gamut, fast response speed, high luminous efficiency, high brightness, high contrast, ultra-thinness, ultra-lightness, low power consumption, wide operating temperature range, having large-size and flexible panels that can be manufactured, and simple manufacturing processes, and can achieve real flexible display, which can best meet people's requirements for future displays.

In order to improve the contrast of display apparatuses and achieve an integral black effect, the OLED devices typically use polarizers (POL), which can effectively reduce reflection intensity of the external ambient light on the devices. However, light transmittances of the polarizers are generally only about 44%. In order to achieve higher outgoing light brightness, it is necessary to provide more power. Moreover, thicknesses of the polarizers are relatively large and materials of the polarizers are brittle, which are not conducive to the development of dynamic bending products. In order to develop the dynamic bending products based on OLED display technologies, new technologies and new processes have to be introduced to replace the polarizers.

For this reason, the industry usually uses POL, free solution (PFS) technologies with color filters (CF) to replace the polarizers. CF structures generally include red (R), green (G) and blue (B) color-resist units and black matrixes (BM). The red (R), green (G) and blue (B) color-resist units need to correspond to red, green, and blue pixel units of the OLED devices, respectively. Through the PFS technologies, not only thicknesses of functional layers may be greatly reduced, but also the light transmittances can be increased from 44% to 80%, which greatly increases the outgoing light brightness, thereby reducing the power consumption of the OLED devices.

SUMMARY

The present disclosure provides an organic light emitting display panel, a method for manufacturing the same, and an organic light emitting display apparatus.

The present disclosure provides an organic light emitting display panel, and the organic light emitting display panel includes: an array substrate, a color filter substrate and an encapsulation structure;

the array substrate and the color filter substrate both include a display area and a frame area surrounding the display area, a plurality of OLED pixel units are disposed in the display area of the array substrate, and a plurality of color-resist units are disposed in the display area of the color filter substrate, the array substrate and the color filter substrate are disposed opposite to each other, and the plurality of OLED pixel units and the plurality of color-resist units are disposed in a one-to-one correspondence;

the encapsulation structure includes a sealing frame and/or a sealing layer, the sealing frame and the sealing layer are both disposed between the array substrate and the color filter substrate, and the array substrate and the color filter substrate are adhesively fixed through the sealing frame and/or the sealing layer;

wherein, the sealing frame is formed by curing a frame sealant and is located in the frame area of the array substrate and the color filter substrate, and the sealing layer is formed by curing a filling adhesive and is located in the display area of the array substrate and the color filter substrate.

The present disclosure also provides a method for manufacturing an organic light emitting display panel, and the method for manufacturing the organic light emitting display panel includes:

providing a substrate and a cover plate respectively, forming a TFT array, a plurality of MED pixel units and a thin film encapsulation layer on the substrate in sequence to obtain an array substrate, and forming a black matrix, a plurality of color-resist units and an organic protective layer on the cover plate in sequence to obtain a color filter substrate;

disposing a ring of frame sealant on an edge area of the color filter substrate or the array substrate;

aligning and attaching the color filter substrate and the array substrate; and curing the frame sealant to form a sealing frame;

wherein, a frame area of the array substrate includes a first transition area, an edge defining area, a second transition area, and a dicing area in sequence in a direction away from a display area of the color filter substrate or the array substrate, the thin film encapsulation layer extends to the frame area of the array substrate, and an edge of the thin film encapsulation layer is consistent with an outer edge of the second transition area.

The present disclosure also provides another method for manufacturing an organic light emitting display panel, and the method for manufacturing the organic light emitting display panel includes:

providing a substrate and a cover plate respectively, forming a TFT array, a plurality of OLED pixel units and a thin film encapsulation layer on the substrate in sequence to obtain an array substrate, and forming a black matrix, a plurality of color-resist units and an organic protective layer on the cover plate in sequence to obtain a color filter substrate;

coating a filling adhesive on a display area of the color filter substrate or the array substrate;

aligning and attaching the color filter substrate and the array substrate; and curing the filling adhesive to form a sealing layer;

wherein, a frame area of the array substrate includes a first transition area, an edge defining area, a second transition area, and a dicing area in sequence in a direction away from the display area of the color filter substrate or the array substrate, the thin film encapsulation layer extends to the frame area of the array substrate, and an edge of the thin film encapsulation layer is consistent with an outer edge of the second transition area.

The present disclosure also provides an organic light emitting display apparatus, which includes the organic light emitting display panel described above.

BRIEF DESCRIPTION OF THE DRAWINGS

The drawings here are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
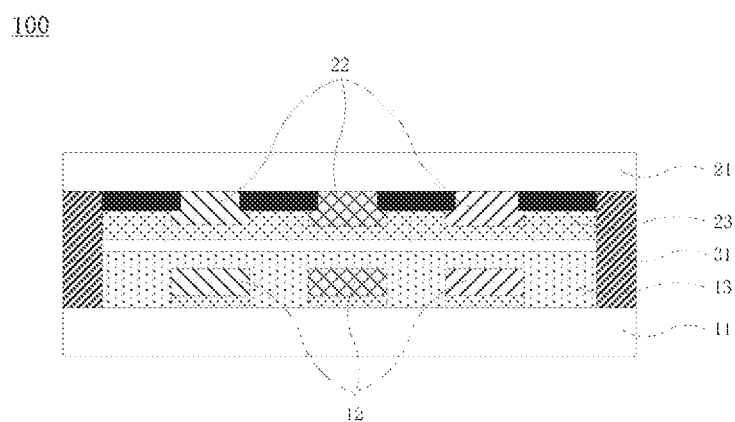
FIG. 1 shows a cross-sectional view of an organic light emitting display panel according to an embodiment of the present disclosure.

Example embodiments will now be described more fully with reference to the accompanying drawings. However, the example embodiments can be implemented in a variety of forms and should not be construed as being limited to the embodiments set forth herein; rather, these embodiments are provided so that the present disclosure will be more comprehensive and complete so as to convey the idea of the example embodiments to those skilled in the art. The same reference numerals in the figures denote the same or similar structures, and thus their repeated description will be omitted.

As mentioned above, in order to improve the contrast of display apparatuses and achieve an integral black effect, the OLED devices typically use polarizers (POL), which can effectively reduce reflection intensity of the external ambient light on the devices. However, light transmittances of the polarizers are generally only about 44%. In order to achieve higher outgoing light brightness, it is necessary to provide more power. Moreover, thicknesses of the polarizers are relatively large and materials of the polarizers are brittle, which are not conducive to the development of dynamic bending products. In order to develop the dynamic bending products based on OLED display technologies, new technologies and new processes have to be introduced to replace the polarizers.

For this reason, the industry usually uses POL free solution (PFS) technologies with color filters (CF) to replace the polarizers. CF structures generally include red (R), green (G) and blue (B) color-resist units and black matrixes (BM). The red (R), green (G) and blue (B) color-resist units need to correspond to red, green, and blue pixel units of the OLED devices, respectively. Through the PFS technologies, not only thicknesses of functional layers may be greatly reduced, but also the light transmittances can be increased from 44% to 80%, which greatly increases the outgoing light brightness, thereby reducing the power consumption of the OLED devices.

It is well known that electrodes and organic layers of the OLED devices are susceptible to corrosion by water and oxygen, leading to a reduction in lifespan. Therefore, OLED display panels need to be encapsulated. However, during actual production and use, it is found that the OLED display apparatuses manufactured with the PFS technologies have a problem of poor encapsulation effect, and the water and oxygen easily enter the inside of the OLED devices and cause the failure of organic light emitting layers.

Figure 2:
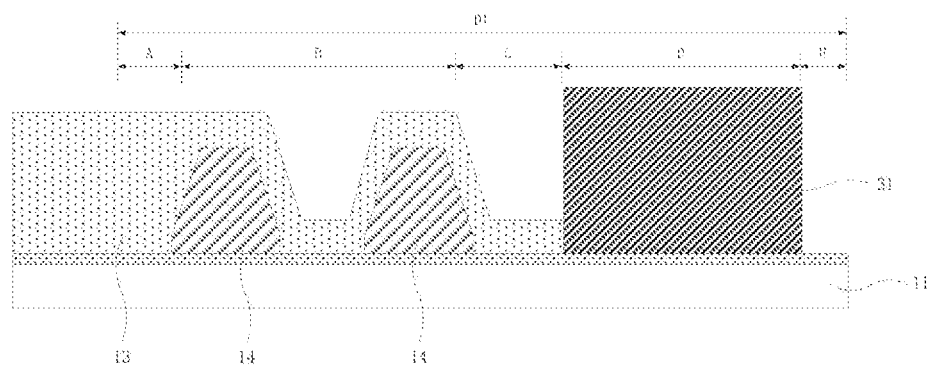
FIG. 2 shows a cross-sectional view of an edge of an organic light emitting display panel according to an embodiment of the present disclosure.
Figure 3:
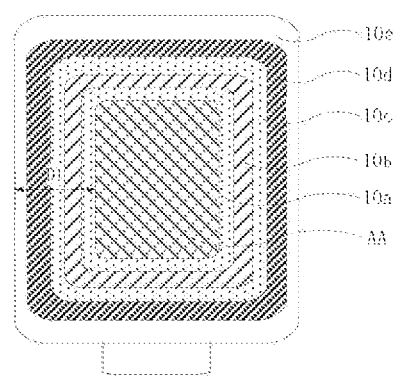
FIG. 3 shows a top view of an array substrate according to an embodiment of the present disclosure.

Reference is made to FIGS. 1 to 3, which are schematic structural diagrams of an organic light emitting display panel according to an embodiment of the present disclosure. As shown in FIGS. 1 to 3, the organic light emitting display panel 100 includes an array substrate 10, a color filter substrate, and an encapsulation structure, and the array substrate 10 and the color filter substrate both include a display area AA and a frame area surrounding the display area AA. A plurality of OLED pixel units 12 are disposed in the display area AA of the array substrate 10, and a plurality of color-resist units 22 are disposed in the display area of the color filter substrate. The array substrate 10 and the color filter substrate are disposed opposite to each other, and the plurality of OLED pixel units 12 and the plurality of color-resist units 22 are disposed in a one-to-one correspondence. The encapsulation structure includes a sealing frame 31 disposed between the array substrate 10 and the color filter substrate. The array substrate 10 and the color filter substrate are adhesively fixed through the sealing frame 31. The sealing frame 31 is formed by curing a frame sealant and located in the frame area of the array substrate 10 and the color filter substrate.

The array substrate 10 includes a substrate 11, a thin film transistor (TFT) array (not shown with a reference number in the figure), the plurality of OLED pixel units 12, and a thin film encapsulation (TFE) layer 13 stacked in sequence.

The substrate 11 may be a rigid substrate or a flexible substrate, the rigid substrate may be a transparent glass, and the flexible substrate may be a transparent plastic. The TFT array includes a plurality of TFTs arranged in an array, the TFT includes a source/drain (not shown in the figure) and a gate (not shown in the figure), and the TFT may be any one of an amorphous silicon TFT, a poly-silicon TFT or a metal oxide TFT. The plurality of OLED pixel units 12 include red pixel units R, green pixel units G, and blue pixel units B which are all arranged in an array. The thin film encapsulation layer 13 is a continuous film layer and completely covers the plurality of OLED pixel units 12, which can prevent water vapor and oxygen from entering the inside of the OLED pixel units 12.

The color filter substrate includes a cover plate 21, a color filter layer, and an organic protective layer (that is, an OC layer) 23 stacked in sequence. The color filter layer includes the plurality of color-resist units 22 and a black matrix (not shown with a reference number in the figure), and the plurality of color resistance units 22 include red color-resist units R, green color-resist units G, and blue color-resist units B which are all arranged in the array. The black matrix (also called a light shielding layer or a BM layer) is disposed between adjacent color-resist units 22. The organic protective layer 23 covers the black matrix and the color-resist units 22. A light transmittance of the black matrix is almost zero, and the light emitted by the OLED pixel units 12 can only be transmitted through the plurality of color-resist units 22.

The array substrate 10 and the color filter substrate are disposed opposite to each other, and film layers on the substrate 11 (including the plurality of OLED pixel units 12 and the thin film encapsulation layer 13) and film layers on the cover plate 21 (including the plurality of color-resist units 22 and the organic protective layer 23) are all located between the substrate 11 and the cover plate 21. The plurality of color-resist units 22 of the color filter substrate correspond to the plurality of OLED pixel units 12 of the array substrate 10 one by one. In some embodiments, an orthographic projection of a color-resist unit 22 on the substrate 11 is located within an orthographic projection of an OLED pixel unit 12 on the substrate 11.

Reference is made to FIG. 2 and FIG. 3, the frame area of the array substrate 10 includes a first transition area 10a, an edge defining area 10b, a second transition area 10c, a frame sealing area 10d, and a dicing area 10e in sequence in a direction away from the display area AA of the array substrate 10. The first transition area 10a is located between the display area AA and the edge defining area 10b, the second transition area 10c is located between the edge defining area 10b and the frame sealing area 10d, and an edge of the thin film encapsulation layer 13 is consistent with an outer edge of the second transition area 10c. An edge defining structure (i.e., a bank) 14 is disposed in the edge defining area 10b, and the edge defining structure 14 is used to determine a boundary between the display area and a non-display area, that is, the display area can be spaced from the non-display area by the edge defining structure 14.

A width of the first transition area 10a is A, a width of the edge defining area 10b is B, a width of the second transition area 10c is C, a width of the frame sealing area 10d is D, a width of the dicing area 10e is E, and an overall width D1 of the frame area of the array substrate 10 is equal to A+B+C+D+E.

Continuing referring to FIGS. 1 to 3, the encapsulation structure is the sealing frame 31, and the sealing frame 31 is disposed in the frame sealing area 10d, and lies on the TFT array. The sealing frame 31 is a fully closed frame structure, that is, edges of the frame are connected end to end in turn to form the closed structure, and a specific shape of the sealing frame 31 is fitted with a shape of the organic light emitting display panel 100.

In some embodiments, the sealing frame 31 lies on the TFT array. In other embodiments, the sealing frame 31 may also lie on the substrate 11 without the TFT array.

In some embodiments, the sealing frame 31 is formed by curing a frame sealant (that is, a dam glue). The dam glue is an acrylic or epoxy resin adhesive material, and a curing method of the dam glue can be ultraviolet irradiation curing or heating curing.

In some embodiments, a plurality of spacer balls (i.e., spacer particles) are disposed in the dam glue, and the plurality of spacer particles are used to maintain a frame thickness of the organic light emitting display panel 100, so that the frame thickness of the organic light emitting display panel 100 is uniform.

The present disclosure also provides a method for manufacturing an organic light emitting display panel. Continuing referring to FIGS. 1 to 3, the method for manufacturing the organic light emitting display panel 100 includes the following steps.

In a first step, a substrate 11 and a cover plate 21 are respectively provided, and a TFT array, a plurality of OLED pixel units 12 and a thin film encapsulation layer 13 are formed on the substrate 11 in sequence to obtain an array substrate 10, a black matrix, a plurality of color-resist units 22 and an organic protective layer 23 are formed on the cover plate 21 in sequence to obtain a color filter substrate.

In a second step, a ring of frame sealant is disposed on an edge area of the color filter substrate or the array substrate 10.

In a third step, the color filter substrate and the array substrate 10 are aligned and attached.

In a fourth step, the frame sealant is cured to form a sealing frame 31, and encapsulation of the organic light emitting display panel 100 is achieved through the sealing frame 31.

The array substrate 10 manufactured in the first step includes a display area AA and a frame area surrounding the display area AA, and the plurality of OLED pixel units 12 are located in the display area AA. The thin film encapsulation layer 13 covers the plurality of OLED pixel units 12, and extends into the frame area of the array substrate 10. The frame area includes a first transition area 10a, an edge defining area 10b, a second transition area 10c, a frame sealing area 10d, and a dicing area 10e in sequence in a direction away from the display area AA of the array substrate 10. An edge of the thin film encapsulation layer 13 is consistent with an outer edge of the second transition area 10c.

In the second step, a coating position of the frame sealant (i.e., the dam glue) is selected according to specific positions of the color filter substrate and the array substrate 10 in an attaching process. In some embodiments, since the color filter substrate is located below the array substrate 10 during the attaching process, the dam glue is coated on the color filter substrate, and the coating position corresponds to the frame sealing area 10d of the array substrate 10. If the color filter substrate is located above the array substrate 10 when the color filter substrate is to be attached to the array substrate 10, the dam glue can be coated on the array substrate 10 and the coating position is located on the frame sealing area 10d of the frame area.

In the third step, the array substrate 10 and the color filter substrate are disposed opposite to each other, and when the array substrate 10 and the color filter substrate are attached, the plurality of OLED pixel units 12 correspond to the plurality of color-resist units 22 one by one.

In the fourth step, the dam glue is cured by ultraviolet irradiation or heating, and after the dam glue is cured, the sealing frame 31 is formed, thereby completing the encapsulation of the organic light emitting display panel 100.

After the encapsulation is completed, dicing is performed along a predetermined dicing lane (located at an outer edge of the dicing area 10e), and the organic light emitting display panel 100 is finally obtained.

The present disclosure also provides an organic light emitting display apparatus, which includes the organic light emitting display panel 100 described above. Reference may be made to the above content for details, and repeated content will not be given here.

In the prior art, the array substrate and the color filter substrate of the organic light emitting display panel are generally fixed and encapsulated by an adhesive glue. As a result, encapsulation reliability is relatively poor, the water and oxygen easily enter the inside of the OLED device and cause the failure of the organic light emitting layer. In the present disclosure, the sealing frame 31 formed by curing the dam glue is used to connect the edge of the array substrate 10 and the edge of the color filter substrate, thereby achieving effective encapsulation. Not only the adhesive glue is not needed, but also the process is simpler, thereby improving production efficiency and reducing the cost.

Figure 4:
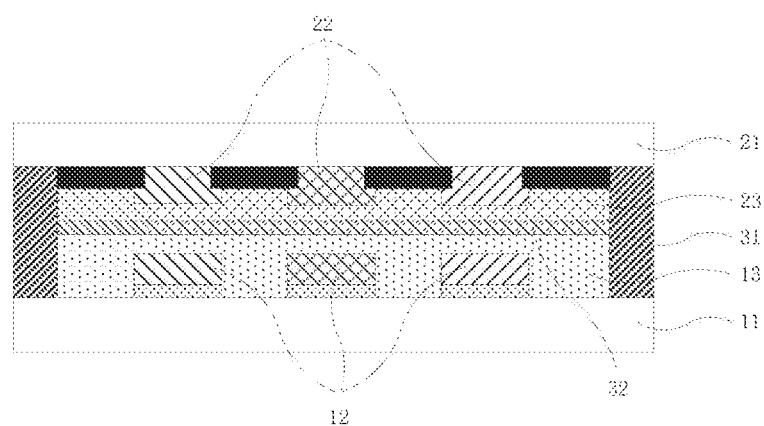
FIG. 4 shows a cross-sectional view of an organic light emitting display panel according to an embodiment of the present disclosure.
Figure 5:
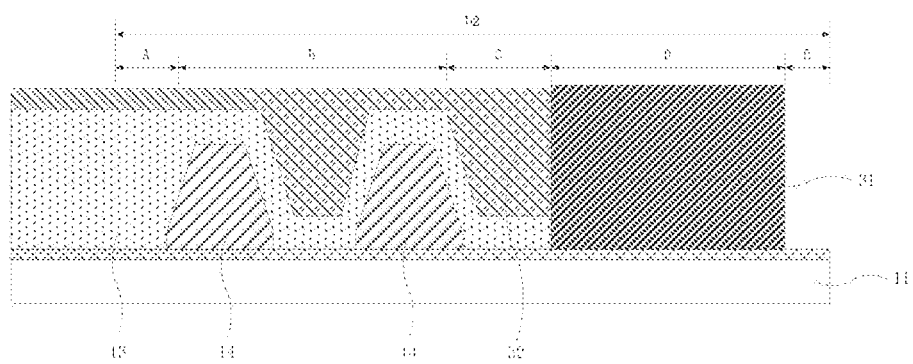
FIG. 5 shows a cross-sectional view of an edge of an organic light emitting display panel according to an embodiment of the present disclosure.

Reference is made to FIGS. 3 to 5, which are schematic structural diagrams of an organic light emitting display panel according to an embodiment of the present disclosure. As shown in FIGS. 3 to 5, the organic light emitting display panel 200 includes an array substrate 10, a color filter substrate, and an encapsulation structure, and the array substrate 10 and the color filter substrate both include a display area AA and a frame area surrounding the display area AA. A plurality of OLED pixel units 12 are disposed in the display area AA of the array substrate 10, and a plurality of color-resist units 22 are disposed in the display area of the color filter substrate. The array substrate 10 and the color filter substrate are disposed opposite to each other, and the plurality of OLED pixel units 12 and the plurality of color-resist units 22 are disposed in a one-to-one correspondence. The encapsulation structure includes both a sealing frame 31 and a sealing layer 32 disposed between the array substrate 10 and the color filter substrate. The array substrate 10 and the color filter substrate are adhesively fixed through the sealing frame 31 and the sealing layer 32. The sealing frame 31 is formed by curing a frame sealant and located in the frame area of the array substrate 10 and the color filter substrate. The sealing layer 32 is formed by curing a filling adhesive and is located in the display area AA of the array substrate 10 and the color filter substrate.

The array substrate 10 and the color filter substrate are disposed opposite to each other, and the plurality of color-resist units 22 of the color filter substrate correspond to the plurality of OLED pixel units 12 of the array substrate 10 one by one. The encapsulation structure includes both the sealing frame 31 and the sealing layer 32 disposed between the array substrate 10 and the color filter substrate, the sealing frame 31 is disposed in the frame area of the array substrate 10 and the color filter substrate, and the sealing layer 32 is disposed in the display area AA of the array substrate 10 and the color filter substrate.

As shown in FIG. 4, the sealing layer 32 is filled between a thin film encapsulation layer 13 of the array substrate 10 and an organic protective layer 23 of the color filter substrate, and is located within a range defined by the sealing frame 31. As shown in FIG. 5, the frame area of the array substrate 10 includes a first transition area 10a, an edge defining area 10b, a second transition area 10c, a frame sealing area 10d, and a dicing area 10e. An overall width D2 of the frame area of the array substrate 10 is equal to A+B+C+D+E, and the sealing frame 31 is disposed in the frame sealing area 10d and lies on the TFT array.

In some embodiments, the sealing layer 32 is formed by curing the filling adhesive (that is, fill glue), the sealing frame 31 is formed by curing the dam glue. The curing method of the dam glue and the fill glue can be ultraviolet irradiation curing or heating curing.

In some embodiments, both the dam glue and the fill glue are acrylic or epoxy resin adhesive materials. An optical refractive index of the fill glue is between 1.2 and 1.8. A plurality of spacer balls (i.e., spacer particles) are disposed in the dam glue, and the plurality of spacer particles are used to ensure that an overall frame height of the organic light emitting display panel 100 remains uniform.

In the organic light emitting display panel 200, the encapsulation structure not only includes the sealing frame 31 but also includes the sealing layer 32. In this way, the array substrate 10 and the color filter substrate are not only adhesively fixed through the sealing frame 31, but also attached together by the sealing layer 32, thereby improving the encapsulation reliability.

The present disclosure also provides a method for manufacturing an organic light emitting display panel. Continuing referring to FIGS. 3 to 5, the method for manufacturing for the organic light emitting display panel 200 includes the following steps.

In first step, a substrate 11 and a cover plate 21 are respectively provided, and a TFT array, a plurality of OLED pixel units 12 and a thin film encapsulation layer 13 are formed on the substrate 11 in sequence to obtain an array substrate 10, a black matrix, a plurality of color-resist units 22 and an organic protective layer 23 are formed on the cover plate 2 in sequence to obtain a color filter substrate.

In a second step, a ring of frame sealant is disposed on an edge area of the color filter substrate or the array substrate 10, and a filling adhesive is coated on a display area AA of the color filter substrate or the array substrate 10 to form a sealing layer 32.

In a third step, the color filter substrate and the array substrate 10 are aligned and attached.

In a fourth step, the frame sealant is cured to form a sealing frame 31, and encapsulation of the organic light emitting display panel 200 is achieved through the sealing frame 31 and the sealing layer 32 together.

In the second step, the dam glue and the till glue are selected to be coated on the organic protective layer 23 of the color filter substrate or on the thin film encapsulation layer 13 of the array substrate 10 according to positions of the color filter substrate and the array substrate 10 when they are attached.

The present disclosure also provides an organic light emitting display apparatus, which includes the organic light emitting display panel 200 described above. Reference may be made to the above content for details, and repeated content will not be given here.

Figure 6:
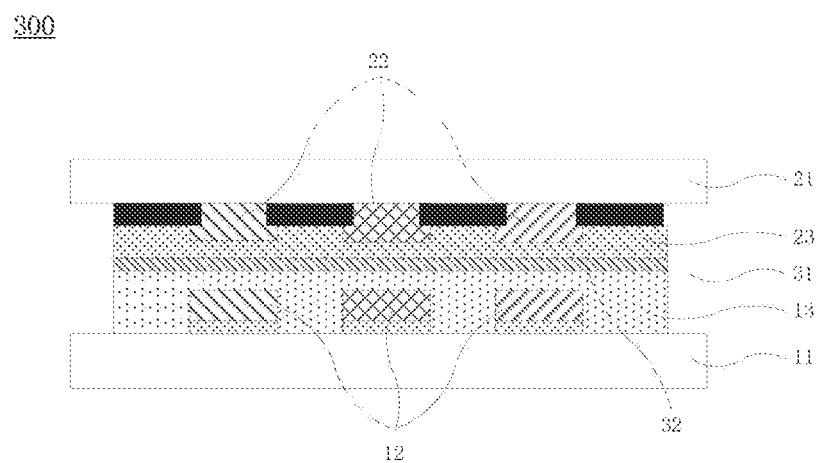
FIG. 6 shows a cross-sectional view of an organic light emitting display panel according to an embodiment of the present disclosure.
Figure 7:
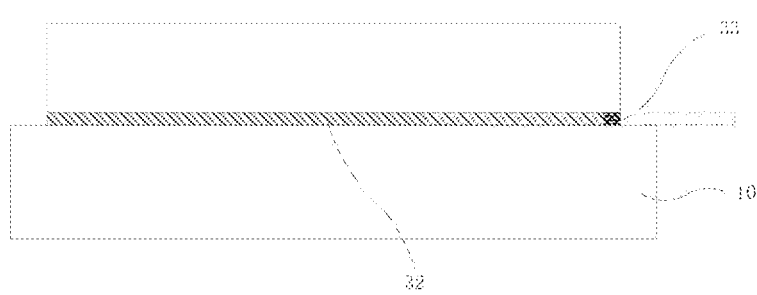
FIG. 7 shows a cross-sectional view of an organic light emitting display panel when crimped with a chip on pi (COP) according to an embodiment of the present disclosure.

Reference is made to FIGS. 3, 6 and 7, which are schematic structural diagrams of an organic light emitting display panel according to an embodiment of the present disclosure. As shown in FIGS. 3, 6 and 7, the organic light emitting display panel 300 includes: an array substrate 10, a color filter substrate, and an encapsulation structure, and the array substrate 10 and the color filter substrate both include a display area AA and a frame area surrounding the display area AA. A plurality of OLED pixel units 12 are disposed in the display area AA of the array substrate 10, and a plurality of color-resist units 22 are disposed in the display area of the color filter substrate. The array substrate 10 and the color filter substrate are disposed opposite to each other, and the plurality of OLED pixel units 12 and the plurality of color-resist units 22 are disposed in a one-to-one correspondence. The encapsulation structure includes a sealing layer 32 disposed between the array substrate 10 and the color filter substrate. The array substrate 10 and the color filter substrate are adhesively fixed through the sealing layer 32. The sealing layer 32 is formed by curing a filling adhesive and is located in the display area AA of the array substrate 10 and the color filter substrate.

A side of the sealing layer 32 corresponds to a crimping side of the organic light emitting display panel (towards a chip on film (COF)), and this side is provided with a blocking structure 33, and the blocking structure 33 is used to block the filling adhesive from overflowing to a crimping area of the organic light emitting display panel.

Since the fill glue is prone to overflow before being cured, it may cause a poor crimping problem once it overflows to the crimping area. Therefore, it is necessary to dispose the blocking structure 33 on the side of the sealing layer 32 towards the COF to avoid the filling adhesive from overflowing to a bonding area of the COF (that is, the crimping area of the organic light emitting display panel 300).

In the organic light emitting display panel 300, the encapsulation structure is not the sealing frame 31 but the sealing layer 32, and an edge of the sealing layer 32 is also provided with the blocking structure 33, which can block the filling adhesive (i.e., the sealing layer 32) from overflowing.

The blocking structure 33 can be formed by curing the dam glue, or can be formed by a chemical vapor deposition process in the manufacturing process of the array substrate 10 or the color filter substrate. Both the dam glue and the fill glue are acrylic or epoxy resin adhesive materials. In some embodiments, an optical refractive index of the fill glue is between 1.2 and 1.8.

The present disclosure also provides a method for manufacturing an organic light emitting display panel. Continuing referring to FIGS. 3, 6 and 7, the method for manufacturing the organic light emitting display panel 300 includes the following steps.

In first step, a substrate 11 and a cover plate 21 are respectively provided, and a TFT array, a plurality of OLED pixel units 12 and a thin film encapsulation layer 13 are formed on the substrate 11 in sequence to obtain an array substrate 10, a black matrix, a plurality of color-resist units 22 and an organic protective layer 23 are formed on the cover plate 2 in sequence to obtain a color filter substrate.

In a second step, a blocking structure 33 is disposed on an edge area of the color filter substrate or the array substrate 10, and a filling adhesive is coated on a display area of the color filter substrate or the array substrate 10 to form a sealing layer 32.

In a third step, the color filter substrate and the array substrate 10 are aligned and attached, thereby achieving encapsulation of the organic light emitting display panel 300.

The present disclosure also provides an organic light emitting display apparatus, which includes the organic light emitting display panel 300 described above. Reference may be made to the above content for details, and repeated content will not be given here.

Figure 8:
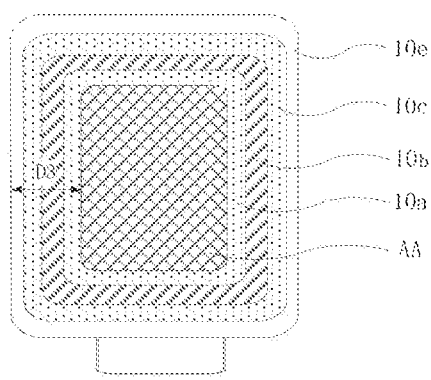
FIG. 8 shows a top view of an array substrate according to an embodiment of the present disclosure.
Figure 9:
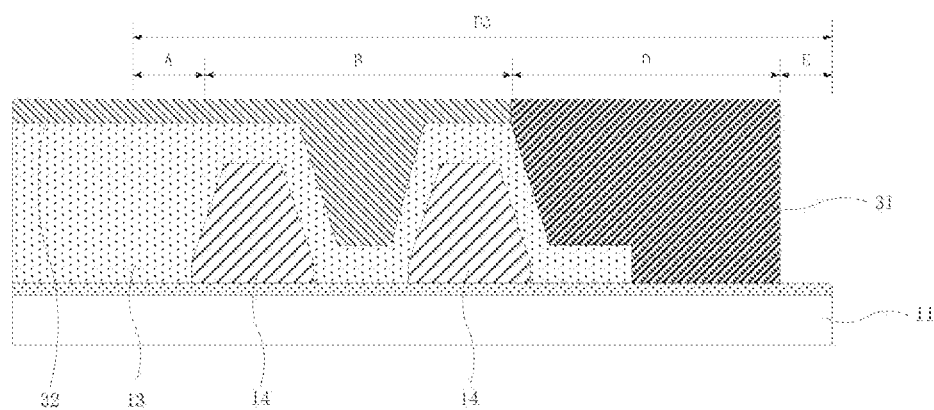
FIG. 9 shows a cross-sectional view of an edge of an organic light emitting display panel according to an embodiment of the present disclosure.

Reference is made to FIGS. 4, 8 and 9, which are schematic structural diagrams of an organic light emitting display panel according to an embodiment of the present disclosure. As shown in FIGS. 4, 8 and 9, the organic light emitting display panel includes an array substrate 20, a color filter substrate, and an encapsulation structure, and the array substrate 20 and the color filter substrate both include a display area AA and a frame area surrounding the display area AA. A plurality of OLED pixel units 12 are disposed in the display area AA of the array substrate 20, and a plurality of color-resist units 22 are disposed in the display area of the color filter substrate. The array substrate 20 and the color filter substrate are disposed opposite to each other, and the plurality of OLED pixel units 12 and the plurality of color-resist units 22 are disposed in a one-to-one correspondence. The encapsulation structure includes both a sealing frame 31 and a sealing layer 32 disposed between the array substrate 20 and the color filter substrate. The array substrate 20 and the color filter substrate are adhesively fixed through the sealing frame 31 and the sealing layer 32. The sealing frame 31 is formed by curing a frame sealant and is located in the frame area of the array substrate 20 and the color filter substrate. The sealing layer 32 is formed by curing a filling adhesive and is located in the display area AA of the array substrate 20 and the color filter substrate.

The frame area of the array substrate 20 includes a first transition area 10a, an edge defining area 10b, a second transition area 10c and a dicing area 10e. With reference to FIGS. 8 and 9, a width of the first transition area 10a is A, a width of the edge defining area 10b is B, a width of the second transition area 10c is D, a width of the dicing area 10e is E, and an overall width D3 of the frame area of the array substrate 20 is equal to A+B+D+E.

With reference to FIG. 8, no frame sealing area is disposed between the second transition area 10c and the dicing area 10e, and the sealing frame 31 is not disposed in the frame sealing area, but disposed in the second transition area 10c. Since the thin film encapsulation layer 13 is disposed in the second transition area 10c, the sealing frame 31 lies on the thin film encapsulation layer 13, instead of the substrate 11 or the TFT array. In this way, the frame area of the array substrate 20 can be free of the frame sealing area, thereby achieving the purpose of narrow frame.

In the manufacturing process of the organic light emitting display panel provided by the embodiments, a coating position of the frame sealant corresponds to the second transition area 10c of the array substrate 20.

Figure 10:
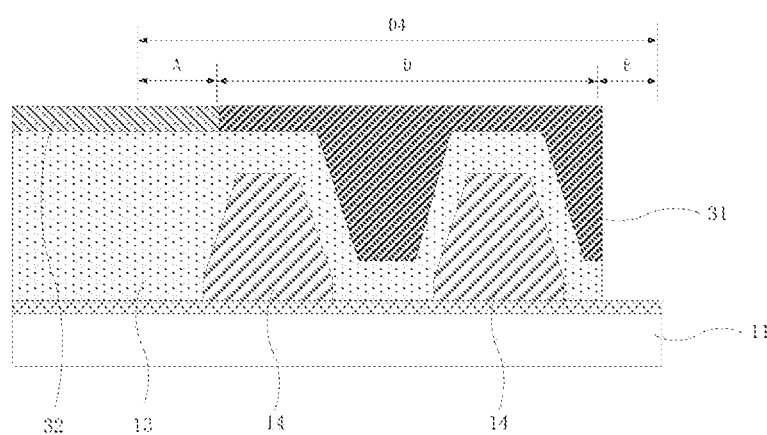
FIG. 10 shows a cross-sectional view of an edge of an organic light emitting display panel according to another embodiment of the present disclosure.

In another embodiment, the sealing frame 31 can also be disposed in the edge defining area 10b and the second transition area 10c to further reduce the overall width of the frame area. Correspondingly, in the manufacturing process of the organic light emitting display panel, the coating position of the frame sealant corresponds to the edge defining area 10b and the second transition area 10c of the array substrate. As shown in FIG. 10, the frame area of the array substrate 20 includes the first transition area 10a, the edge defining area 10b, the second transition area 10c, and the dicing area 10e, and the sealing frame 31 is disposed in the edge defining area 10b and the second transition area 10c. A sum of widths of the edge defining area 10b and the second transition area 10c is D, a width of the first transition area 10a is A, a width of the dicing area 10e is E, and an overall width D4 of the frame area of the array substrate 20 is equal to A+D+E.

Figure 11:
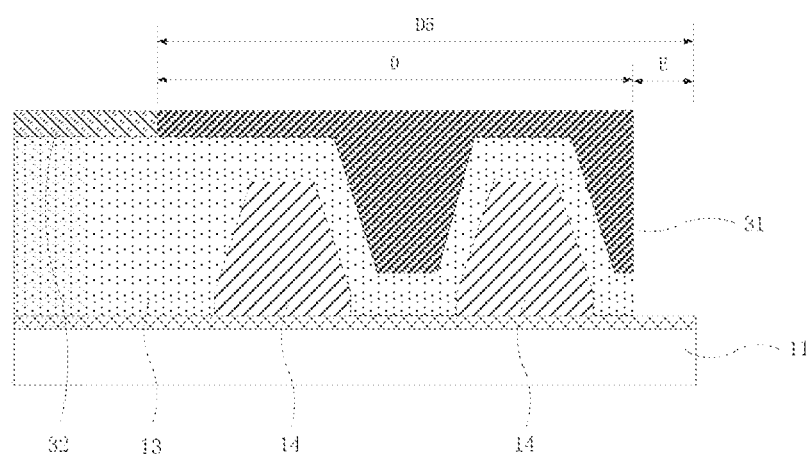
FIG. 11 shows a cross-sectional view of an edge of an organic light emitting display panel according to still another embodiment of the present disclosure.

In another embodiment, the sealing frame 31 can also be disposed in the first transition area 10a, the edge defining area 10b and the second transition area 10c to further reduce the overall width of the frame area. Correspondingly, in the manufacturing process of the organic light emitting display panel, the coating position of the frame sealant corresponds to the first transition area 10a, the edge defining area 10b and the second transition area 10c of the array substrate. As shown in FIG. 11, the frame area of the array substrate 20 includes the first transition area 10a, the edge defining area 10b, the second transition area 10c and the dicing area 10e, and the sealing frame 31 is disposed in the first transition area 10a, the edge defining area 10b and the second transition area 10c. A sum of widths of the first transition area 10a, the edge defining area 10b and the second transition area 10c is D, the width of the dicing area 10e is E, and an overall width D5 of the frame area of the array substrate 20 is equal to D+E.

In addition, the sealing frame 31 can be made of a transparent material. In this way, the sealing frame 31 can also be disposed in the first transition area 10a, the second transition area 10c, the edge defining area 10b, and part of the display area AA to further reduce the overall width of the frame area and to reduce a width limitation on the sealing frame 31. Correspondingly, in the manufacturing process of the organic light emitting display panel, the coating position of the frame sealant corresponds to the first transition area 10a, the edge defining area 10b, the second transition area 10c and part of the display area AA close to the frame area of the array substrate. In some embodiments, when the dam glue may be disposed in part of the display area AA, an optical refractive index of the dam glue and an optical refractive index of the fill glue are both between 1.2 and 1.8, in order not to affect the display effect. In other embodiments, when the dam glue is disposed in the non-display area, there is no limitation on the optical refractive index of the dam glue.

In the above embodiments, since the thin film encapsulation layer 13 extends to the outer edge of the second transition area 10c, the sealing frame 31 lies on the thin film encapsulation layer 13. The frame area of the array substrate 20 can not only be free of the frame sealing area to achieve the purpose of narrow frame, but also there is less limitations on the width of the sealing frame 31, that is, the width of the sealing frame 31 can be increased to the sum of the widths of the first transition area 10a, the edge defining area 10b and the second transition area 10c of the array substrate 20, and can be even wider. In this way, not only the process difficulty of manufacturing the sealing frame 31 is reduced, but also the negative effect on the encapsulation due to the narrow width can be avoided.

Figure 12:
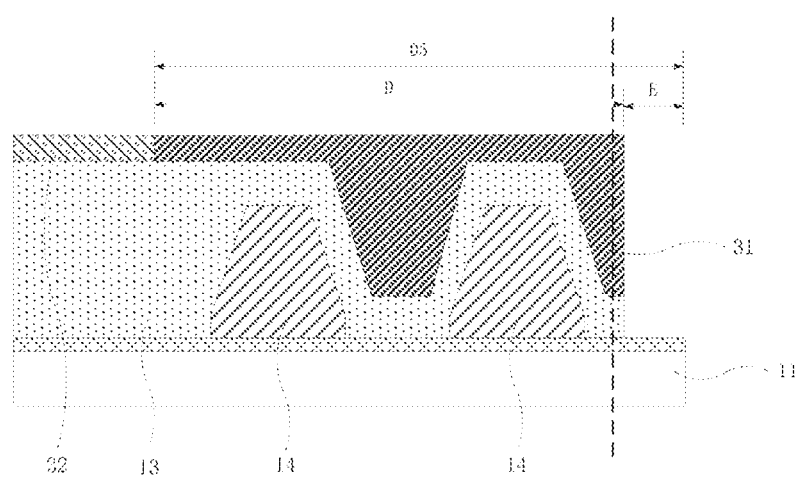
FIG. 12 shows a cross-sectional view of an edge of an organic light emitting display panel according to still another embodiment of the present disclosure.

In the above embodiments, dicing lanes of the organic light emitting display panel are all disposed at the edge of the dicing area 10e. In other embodiments, the dicing lanes of the organic light emitting display panel may also be disposed on the sealing frame 31 formed by curing the dam glue. As shown in FIG. 12, the dicing lane (shown by the vertical dashed line in the figure) is disposed on the sealing frame 31, and the frame width of the organic light emitting display panel obtained by dicing along the dicing lane is further reduced. The reduced width includes the width E of the dicing area 10e and part of the width D (that is, part of the width of the sealing frame 31).

It should be noted that the position and the width of the above-mentioned sealing frame 31 are only examples, rather than limitation, and those skilled in the art can set the position and the width of the sealing frame 31 according to actual needs. In the above-mentioned embodiments, the sealing frame 31 is located in the second transition area 10c and its width is the same as the width of the second transition area 10c, or is just located in the edge defining area 10b and the second transition area 10c and its width is the same as the sum of widths of the edge defining area 10b and the second transition area 10c, or is just located in the first transition area 10a, the edge defining area 10b and the second transition area 10c and its width is the same as the sum of widths of the first transition area 10a, the edge defining area 10b and the second transition area 10c. In other embodiments, when the sealing frame 31 is located in the second transition area 10c, its width may be inconsistent with the width of the second transition area 10c; when the sealing frame 31 is located in the edge defining area 10b and the second transition area 10c, its width may be inconsistent with the sum of the widths of the edge defining area 10b and the second transition area 10c; and when the sealing frame 31 is located in the first transition area 10a, the edge defining area 10b and the second transition area 10c, its width may be inconsistent with the sum of the widths of the first transition area 10a, the edge defining area 10b and the second transition area 10c.

In other embodiments, the sealing frame 31 may also expand outwards to increase a spacing between the sealing frame 31 and the display area AA, so that the coating position of the dam glue is far away from the display area AA to avoid the dam glue overflowing to the display area AA. Hereinafter, an example of manufacturing six organic light emitting display panels on one substrate is used for description.

Figure 13:
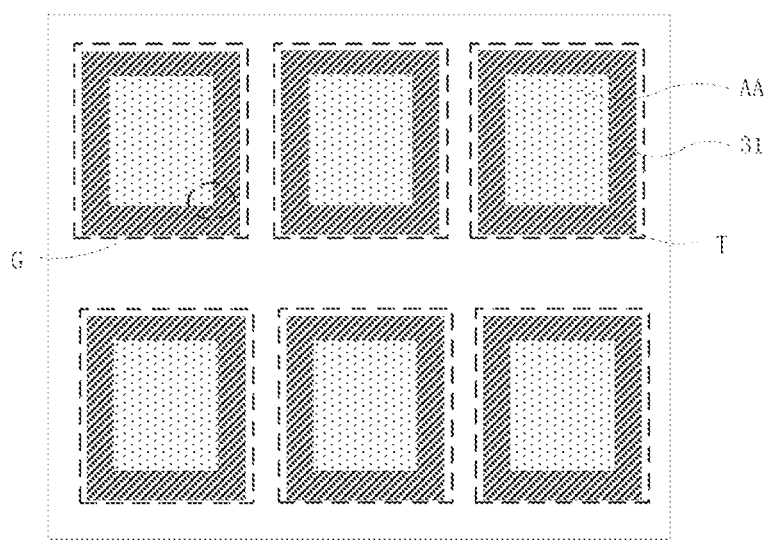
FIG. 13 shows a schematic structural diagram of an organic light emitting display panel in a manufacturing process in the prior art.

Reference is made to FIG. 13, which is a schematic structural diagram of an organic light emitting display panel in a manufacturing process in the prior art. As shown in FIG. 13, in the prior art, the organic light emitting display panel is generally rectangular. Correspondingly, each sealing frame 31 generally has four edges, and the four edges of the sealing frame 31 are all adjacent to edges of the display area AA, that is, the coating position of the dam glue is very close to the edges of the display area AA. There is a risk of the dam glue overflowing to the display area A at a corner position G.

Figure 14:
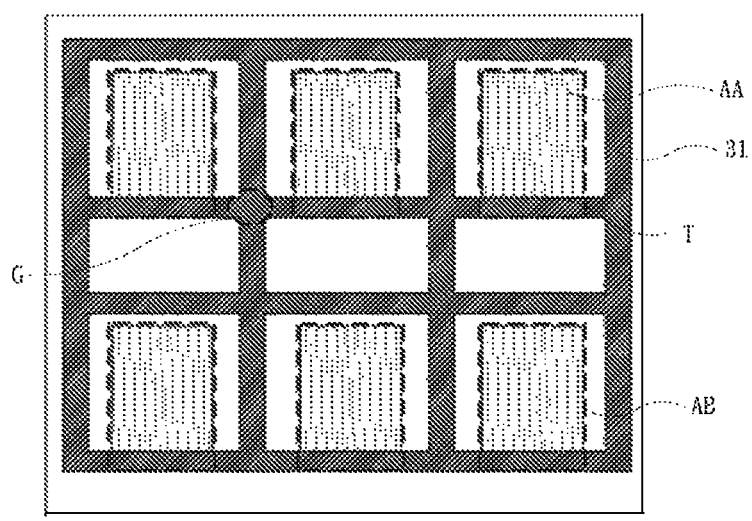
FIG. 14 shows a schematic structural diagram of an organic light emitting display panel in a manufacturing process according to another embodiment of the present disclosure.

Reference is made to FIG. 14, which is a schematic structural diagram of an organic light emitting display panel in a manufacturing process according to an embodiment of the present disclosure. As shown in FIG. 14, an entire pattern of the dam glue has been expanded outwards. One edge of a frame sealant pattern is extended and connected to an adjacent frame sealant pattern, and the remaining three edges are expanded outwards to a dummy area (not shown with a reference number in the figure), so that the coating position of the dam glue (including the corner position G) is kept at a certain distance from the display area AA, thereby reducing the risk of the dam glue overflowing to the display area AA.

In some embodiments, an edge of the sealing frame 31 corresponding to a crimping side T is not provided with the spacer particles or a size of the spacer particles disposed at the edge of the sealing frame 31 corresponding to the crimping side T is smaller than a size of the spacer particles disposed at the remaining three edges of the sealing frame 31. For example, the size of the spacer particles disposed at the remaining three edges of the sealing frame 31 is 10-17 μm, and the size of the spacer particles disposed at the edge of the sealing frame 31 corresponding to the crimping side T is 1-5 µm smaller than the size of the spacer particles disposed at the remaining three edges of the sealing frame 31.

Since only the sealing layer 32 is used to realize the encapsulation, the degree of freedom of the dicing position is better, and the dicing position can be selected according to actual requirements of the narrow frame design. Continuing referring to FIG. 14, a dicing lane AB of the organic light emitting display panel can be disposed at the edge of the thin film encapsulation layer.

The present disclosure also provides an organic light emitting display apparatus, which includes the organic light emitting display panel described above. Reference may be made to the above content for details, and repeated content will not be given here.

It should be noted that various embodiments in this specification are described in a progressive manner, and each embodiment focuses on differences from other embodiments, and the same or similar parts between the various embodiments can be referred to each other.

The above drawings merely schematically show the organic light emitting display panel provided by the present disclosure. For the sake of clarity, shapes and quantity of components in the above figures are simplified, and some components are omitted. Those skilled in the art can make changes according to actual needs. These changes are within the protection scope of the present disclosure and will not be repeated here.

In summary, in the organic light emitting display panel, the method for manufacturing the same and the organic light emitting display apparatus provided by the present disclosure, the sealing frame and/or the sealing layer are respectively disposed between the array substrate and the color filter substrate, which can not only improve the encapsulation effect of the array substrate and the color filter substrate, and is conducive to the realization of narrow frame.

The above content is a further detailed description of the present disclosure in combination with specific embodiments, and it cannot be considered that the specific implementations of the present disclosure are limited to these descriptions. For those of ordinary skill in the technical field to which the present disclosure belongs, a number of simple deductions or substitutions can be made without departing from the concept of the present disclosure, which should be regarded as falling within the protection scope of the present disclosure.

What is claimed is:

1. An organic light emitting display panel, comprising:
    an array substrate, comprising a display area and a frame area surrounding the display area, wherein a plurality of organic light emitting display (OLED) pixel units are disposed in the display area of the array substrate;
    a color filter substrate, comprising a display area and a frame area surrounding the display area, wherein the array substrate and the color filter substrate are disposed opposite to each other; and
    an encapsulation structure, comprising at least one of a sealing frame and a sealing layer disposed between the array substrate and the color filter substrate;
    wherein the sealing frame is formed by curing a frame sealant and is located in the frame area of the array substrate and the color filter substrate, and the sealing layer is formed by curing a filling adhesive and is located in the display area of the array substrate and the color filter substrate,
    wherein the frame area of the array substrate comprises a first transition area, an edge defining area, a second transition area and a dicing area in sequence in a direction away from the display area of the color filter substrate or the array substrate, wherein the frame area of the array substrate further comprises a frame sealing area, the frame sealing area is located between the second transition area and the dicing area, and the sealing frame is disposed in the frame sealing area; and
    a thin film encapsulation layer is disposed on the plurality of OLED pixel units, the thin film encapsulation layer extends to the frame area of the array substrate, and an edge of the thin film encapsulation layer is consistent with an outer edge of the second transition area.

2. The organic light emitting display panel according to claim 1, wherein a plurality of spacer balls are disposed in the frame sealant, and the plurality of spacer balls are used to maintain a frame thickness of the organic light emitting display panel.

3. The organic light emitting display panel according to claim 2, wherein the sealing frame has four edges, one of the four edges corresponds to a crimping side of the organic light emitting display panel, and the remaining three edges are all provided with the plurality of spacer balls, and the edge corresponding to the crimping side of the organic light emitting display panel is not provided with spacer balls; or
    a size of the spacer balls disposed at the edge corresponding to the crimping side of the organic light emitting display panel is smaller than a size of the spacer balls disposed at the remaining three edges.

4. The organic light emitting display panel according to claim 1, wherein a side of the sealing layer corresponds to a crimping side of the organic light emitting display panel, and the side is provided with a blocking structure, and the blocking structure is located at an edge of the filling adhesive and is used to block the filling adhesive from overflowing to a crimping area of the organic light emitting display panel.

5. An organic light emitting display apparatus, comprising: the organic light emitting display panel according to claim 1.

* * * * *